(12) United States Patent
Hastings et al.

(10) Patent No.: US 12,690,165 B2
(45) Date of Patent: Jul. 21, 2026

(54) MANIFOLD SYSTEM FOR COMPUTING ASSEMBLY

(71) Applicant: AMD Design, LLC, Wilmington, DE (US)

(72) Inventors: Robert Hastings, Lakeway, TX (US); Sruti Chigullapalli, Seattle, WA (US); Shubham Sinha, Jersey City, NJ (US); Chen An, Bergenfield, NJ (US)

(73) Assignee: AMD DESIGN, LLC, Wilmington, DE (US)

( * ) Notice: Subject to any disclaimer, the term of this patent is extended or adjusted under 35 U.S.C. 154(b) by 173 days.

(21) Appl. No.: 18/411,347

(22) Filed: Jan. 12, 2024

(65) Prior Publication Data

US 2025/0234483 A1 Jul. 17, 2025

(51) Int. Cl.
*H05K 7/20* (2006.01)
(52) U.S. Cl.
CPC ..... *H05K 7/20272* (2013.01); *H05K 7/20781* (2013.01)

(58) Field of Classification Search
CPC ..................... H05K 7/20272; H05K 7/20781
USPC ..................................................... 361/679.53
See application file for complete search history.

(56) References Cited

U.S. PATENT DOCUMENTS

| | | | |
|---|---|---|---|
| 2017/0181321 A1* | 6/2017 | Shelnutt | H05K 7/20836 |
| 2018/0035569 A1* | 2/2018 | Harrington | H05K 7/20281 |
| 2022/0338374 A1* | 10/2022 | Heydari | H05K 7/20281 |
| 2022/0369520 A1* | 11/2022 | Heydari | G05B 15/02 |
| 2023/0067321 A1* | 3/2023 | Gao | H05K 7/20272 |

* cited by examiner

*Primary Examiner* — Zhengfu J Feng
(74) *Attorney, Agent, or Firm* — SCULLY, SCOTT, MURPHY & PRESSER, P.C.

(57) ABSTRACT

A manifold system is provided. A secondary manifold is operable to be fluidly coupled with a liquid cooling system for each of a plurality of computing devices. The secondary manifold is configured to be positioned above the plurality of computing devices. A containment tray is disposed between the secondary manifold and the computing devices. The containment tray is operable to receive fluid that leaks from the secondary manifold.

17 Claims, 6 Drawing Sheets

MANIFOLD SYSTEM FOR COMPUTING ASSEMBLY

FIELD

The present disclosure relates generally to a manifold system for a computing assembly.

BACKGROUND

Computing devices are continually improving and becoming more powerful. The chips, for example artificial intelligence chips, are becoming more powerful, which leads to increased thermal design power. Liquid cooling is utilized to manage the heat generated by the chips.

BRIEF DESCRIPTION OF THE DRAWINGS

Implementations of the present technology will now be described, by way of example only, with reference to the attached figures, wherein.

DETAILED DESCRIPTION

Figure 1A:
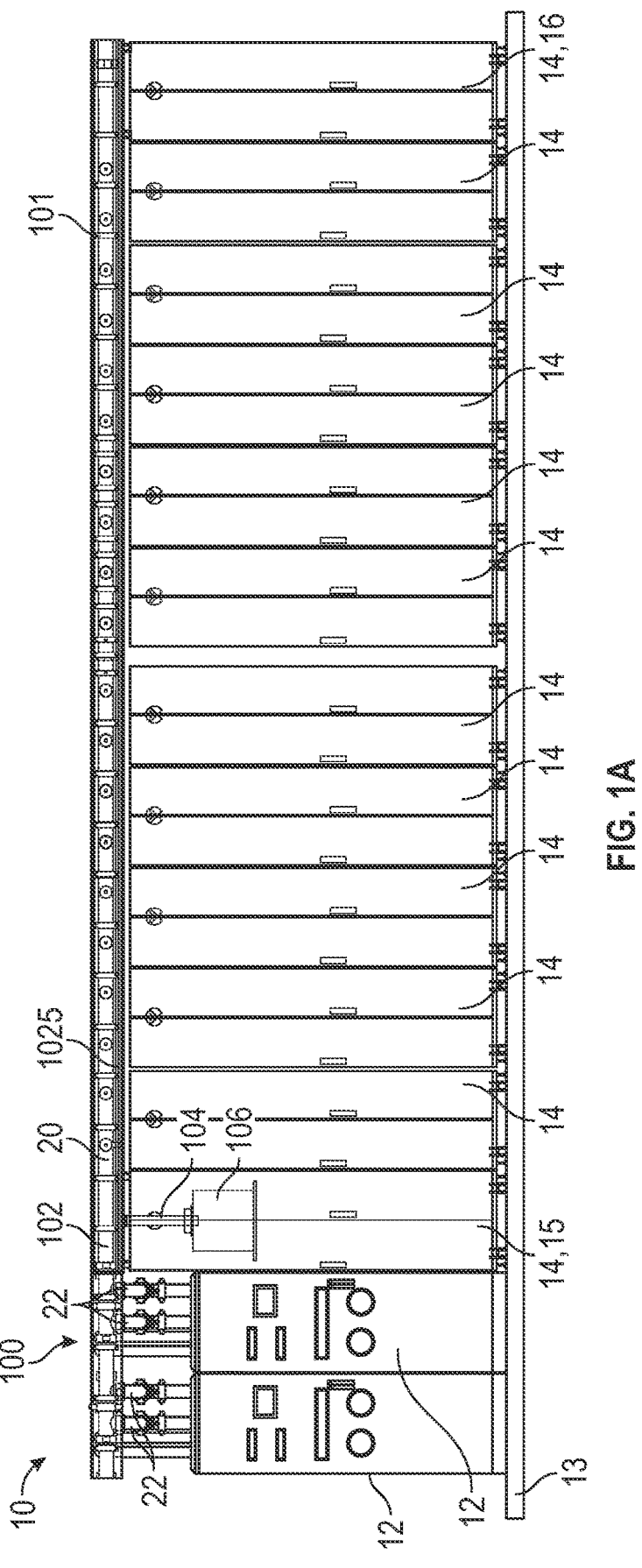
FIG. 1A illustrates a front view of a computing assembly with a manifold system.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented. The term "coupled" is defined as connected, whether directly or indirectly through intervening components, and is not necessarily limited to physical connections. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "about" means reasonably close to the particular value. For example, about does not require the exact measurement specified and can be reasonably close. As used herein, the word "about"

can include the exact number. The term "near" as used herein is within a short distance from the particular mentioned object. The term "near" can include abutting as well as relatively small distance beyond abutting. The terms "comprising," "including" and "having" are used interchangeably in this disclosure. The terms "comprising," "including" and "having" mean to include, but not necessarily be limited to the things so described.

As thermal design power of processors is increasing, liquid cooling systems use cooler facility water, and a secondary manifold distributes the fluid to the individual racks. Conventionally, the liquid cooled computing devices in high performance computers have been deployed in either green field data centers with artificially raised floors or brown-field data centers with originally raised floors. With the conventional raised floors, the fluid can be run under the floor and power can be run overhead to minimize the disruption during accidental leaks. However, a hyperscaler environment can create a unique challenge to deploy liquid cooling on a concrete slab floor.

The presently disclosed manifold system can be a stand-alone manifold system that provides manufacturability, reliability, structural stability, and safety without depending on any data center structure to hold the manifold system in place. The manifold system can be supported on two support racks with a containment tray that provides leak detection and leaked fluid storage capabilities.

The manifold system not only holds a secondary manifold above the racks but also includes a built-in containment receptacle to contain all fluid that may be leaked. The containment tray can be at least partially transparent, and, in some examples, leak detection components can be provided under the secondary manifold to provide dual protection using both visual check and electronic monitoring.

Figure 1B:
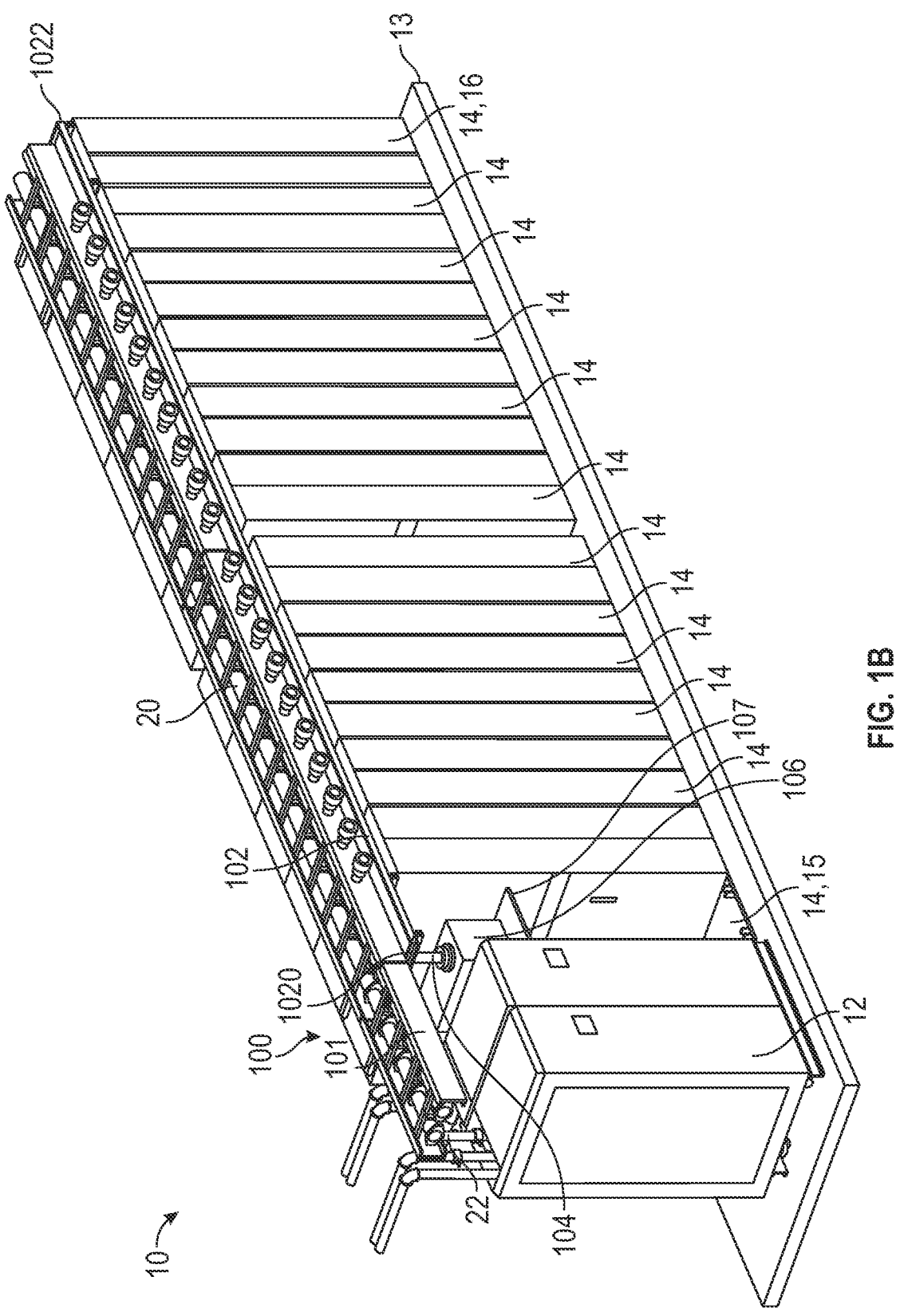
FIG. 1B illustrates a perspective view of the computing assembly.
Figure 5:
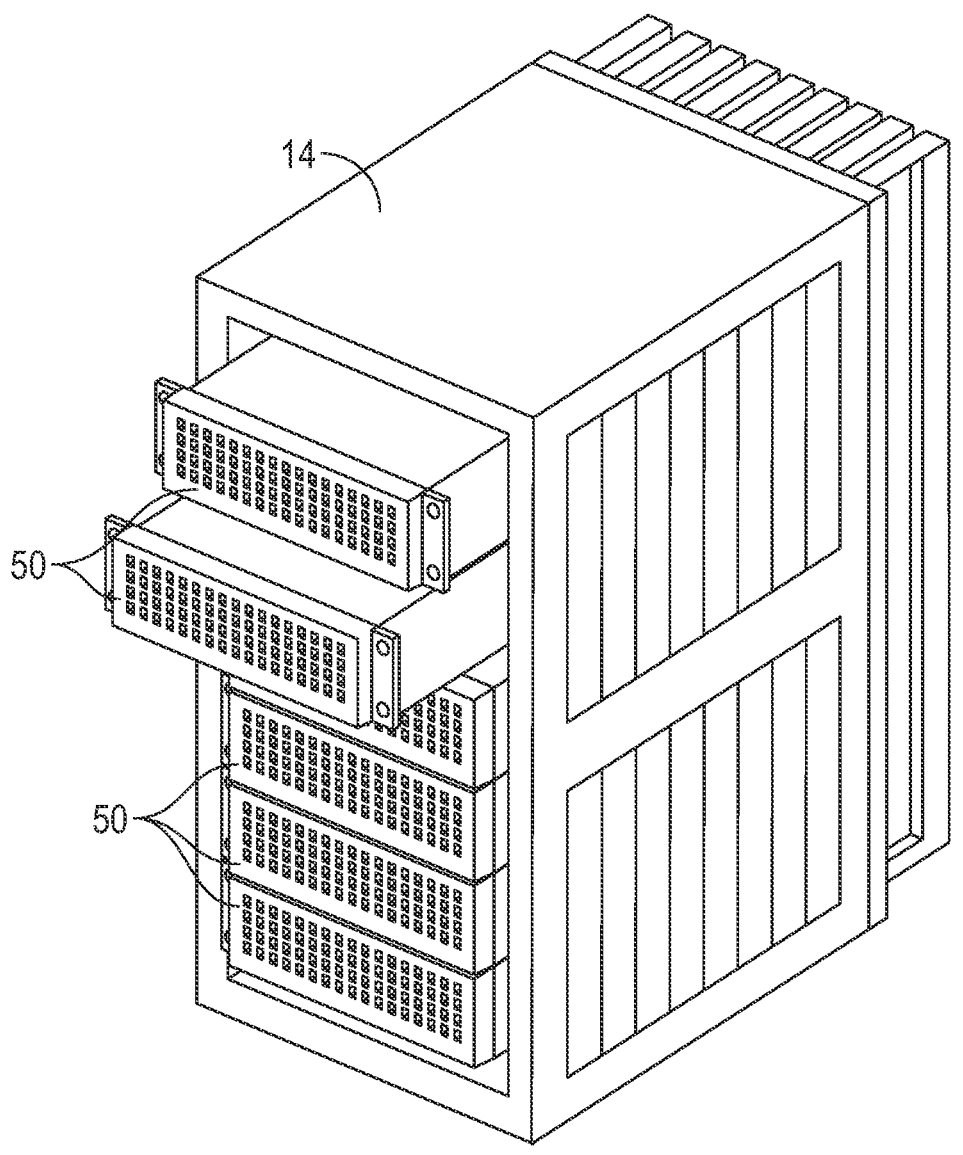
FIG. 5 illustrates the computing devices being received in a rack.

The disclosure now turns to FIGS. 1A and 1B, which illustrate an example of a computing assembly 10 to be used, for example, with a liquid cooled modular server and/or information handling system. The computing system 10 can include one or more racks 14 and a plurality of computing devices 50 (as shown for example in FIG. 5) configured to be received in the one or more racks 14. Each computing device 50 can include a liquid cooling system that is operable to control (e.g., lower) a temperature of one or more computing components (e.g., graphics processing unit, central processing unit, etc.).

Figure 4:
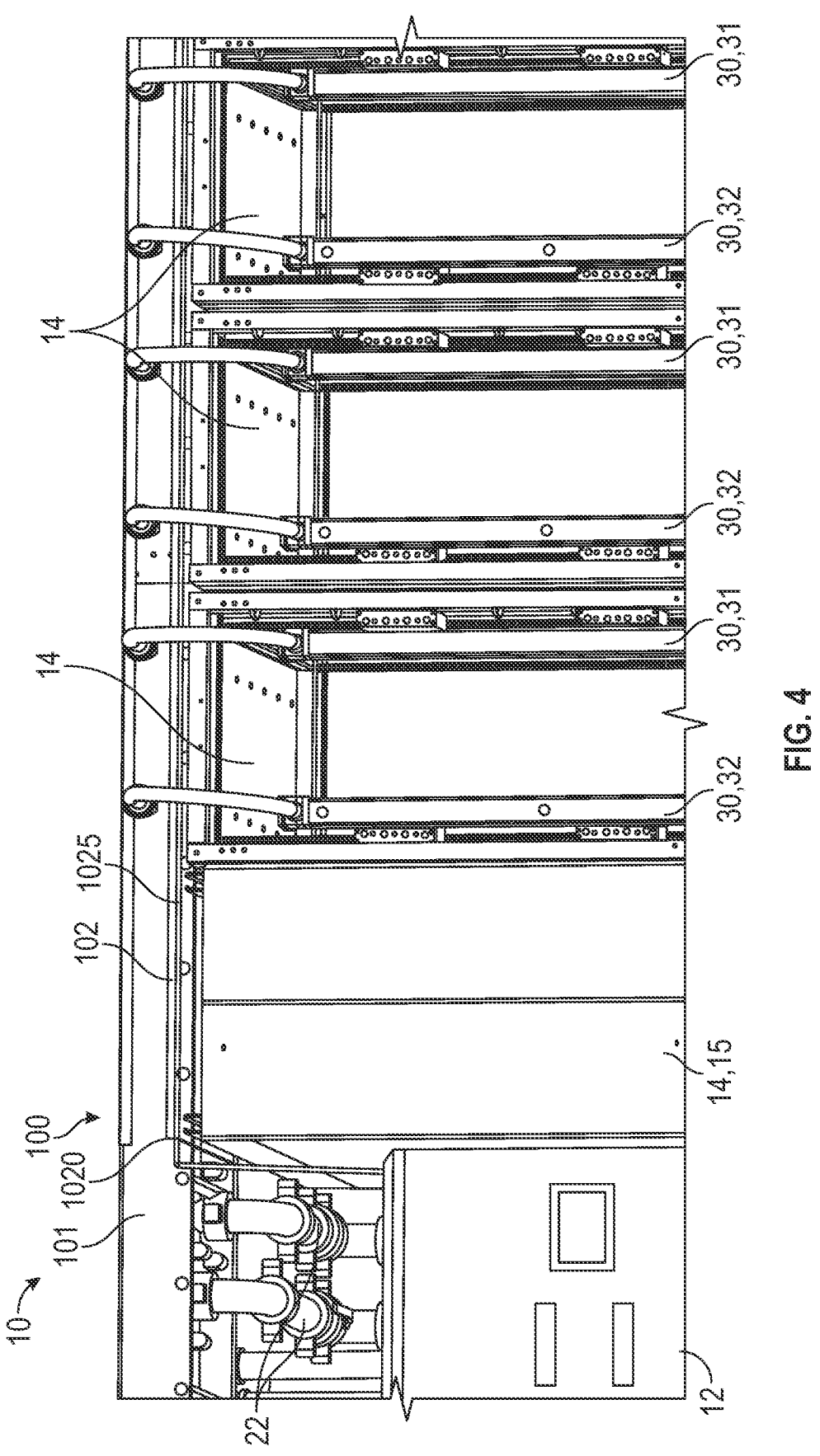
FIG. 4 illustrates the fluid connection between liquid cooling systems of the computing devices in the racks and a secondary manifold of the manifold system.

The computing assembly 10 can include a manifold system 100 that is operable to receive the rack(s) 14 with the computing devices 50 and distribute fluid to and/or from the liquid cooling systems for each computing device 50. For example, the manifold assembly 100 can be operable to be fluidly coupled with a rack manifold 30 (as shown, for example, in FIG. 4) for each rack 14. For example, the rack manifold 30 can include an inlet rack manifold 31 which can be operable to provide fluid from the secondary manifold 20 to the liquid cooling systems for the computing devices 50 and an outlet rack manifold 32 which can be operable to direct fluid from the liquid cooling systems for the computing devices 50 to the secondary manifold 20. The computing devices 50 can be operable to fluidly couple with the rack manifold 30 such that fluid (e.g., water and/or coolant) for the liquid cooling system of the computing device 50 can flow throughout the computing assembly 10 to each computing device 50 received in the rack(s) 14. While the disclosure is focused on providing fluid to the rack manifold 30 which then distributes the fluid to individual computing devices 50, in some examples, the manifold system 100 can be configured to deliver the fluid directly to each computing device 50 without deviating from the scope of the disclosure.

The manifold system 100 can include a secondary manifold 20 operable to be fluidly coupled with the liquid cooling system for each of the computing devices 50 received in the rack(s) 14. The secondary manifold 20 can include a conduit such as a tube and/or a hose that can distribute the fluid to each of the liquid cooling systems. For example, the secondary manifold 20 can be fluidly coupled with the rack manifold 30 for each rack 14. The secondary manifold 20 can span across the manifold system 100 such that the secondary manifold 20 spans across the one or more racks 14 in the computing assembly 10.

The manifold system 100 can be in fluid communication with a fluid distribution unit 12 that is operable to be in fluid communication with the computing devices 50 in the computing assembly 10. The secondary manifold 20 can be operable to direct flow of the fluid between the computing devices 50 and the fluid distribution unit 12. For example, as illustrated in FIGS. 1A-4, the secondary manifold 20 can be fluidly coupled with one or more manifold conduits 22 which is fluidly coupled with the fluid distribution unit. The manifold conduits 22 can be operable to receive and/or dispense the fluid between the fluid distribution unit 12 and the secondary manifold 20. In at least one example, the fluid distribution unit 12 can be operable to pump the fluid through the secondary manifold 20, the rack manifold(s) 30 if applicable, and the liquid cooling systems for each computing device 50. In at least one example, the fluid distribution unit 12 can be operable to cool the fluid that is received from the liquid cooling systems of the computing devices 50 before returning the fluid to the computing devices 50 via the secondary manifold 20.

The racks 14 in the computing assembly 10 can be connected together using the manifold system 100 to create a pod. For example, the racks 14 can be positioned in a row. Conventional manifold systems depend heavily on a raised floor datacenter infrastructure where the conventional manifold systems are provided under the floor. The conventional under-floor manifold systems provided the benefit of running the fluid under the floor and power overhead to minimize the disruption during accidental leaks. However, hyperscalers, such as cloud service providers, use concrete slab and hot aisle containment structures with seismic connections which require a different design from the conventional under-floor manifold systems. Accordingly, the manifold system 100 as disclosed herein provides a standalone manifold system 100 for improved manufacturability, reliability, structural stability, and safety without depending on any data center structure to hold the manifold system 100 in place. For example, the secondary manifold 20 is configured to be positioned above the plurality of computing devices 50 such that there is no need of a raised floor or under-floor set up. In at least one example, the secondary manifold 20 is configured to be positioned above the one or more racks 14 received in the manifold assembly 100. Additionally, in some examples, the manifold system 100 can be independent of support from data center roof design.

Referring to FIGS. 1A-4, the manifold system 100 can include a support structure 101 configured to be positioned above the computing devices 50 and/or the racks 14. The support structure 101 can be operable to receive the secondary manifold 20. For example, the secondary manifold 20 can be received in the support structure 101 and supported by the support structure 101 so that the secondary manifold 20 can be positioned above the computing devices 50 and/or the racks 14. In at least one example, the support structure 101 can include a ladder structure that is laid horizontally (e.g., substantially perpendicular to the gravity vector). The support structure 101 can span the racks 14 and provide structural support to the secondary manifold 20 and/or cables (e.g., power cables, data cables, etc.) above the racks 14. Accordingly, the data center structure does not need any specific configurations or features to receive the computing assembly 10 with the manifold system 100.

In at least one example, as illustrated in FIGS. 1A-4, the support structure 101 can be operable to be supported by two support racks 15, 16 of the one or more racks 14. The support racks 15, 16 can be positioned on opposing ends of the racks 14 receiving the computing devices 50. The support racks 15, 16 can be provided in the row of racks 14 and be on the opposing ends of the row of racks 14. The support structure 101 can span the racks 14 between a first support rack 15 and a second support rack 16. In at least one example, the support structure 101 can be coupled with the support racks 15, 16. In at least one example, the support structure 101 can rest and/or sit on the support racks 15, 16 and have sufficient structural stability to span the two support racks 15, 16. In some examples, the support structure 101 can rest and/or sit on the racks 14 provided between the support racks 15, 16. In some examples, the support structure 101 can be coupled with the racks 14 provided between the support racks 15, 16. In at least one example, one or both of the support racks 15, 16 can be operable to receive one or more computing devices 50. In some examples, the manifold system 100 can include more than two support racks 15, 16 to provide more structural support for the support structure 101 and/or the secondary manifold 20. The manifold system 100 is a self-supporting structure with built-in support racks 15, 16.

The manifold system 100 includes a containment tray 102 disposed between the secondary manifold 20 and the computing devices 50. For example, the containment tray 102 can be disposed between the secondary manifold 20 and the racks 14. In at least one example, the containment tray 102 is disposed underneath the connection point of the secondary manifold 20 and the rack manifolds 30 for the racks 14. In some examples, the containment tray 102 can be disposed between the support structure 101 and the racks 14. Accordingly, the containment tray 102 can be operable to receive fluid that leaks from the secondary manifold 20. This can protect the computing devices 50 in the racks 14 from damage in case of fluid leak. The containment tray 102 provides the leak containment that in conventional computing assemblies was achieved using required under-floor manifolds.

In at least one example, at least a portion of the containment tray 102 can be at least partially transparent. Accordingly, the containment tray 102 can provide the ability for visual inspections to determine whether there are any leaks of the fluid from the secondary manifold 20.

In at least one example, the manifold assembly 100 can include a leak detection component 1025 that is operable to be in fluid communication with the containment tray 102. In some examples, the leak detection component 1025 can be at least partially received in the containment tray 102. The leak detection component 1025 can be operable to detect whether fluid is received in the containment tray 102 which would indicate a leak. In at least one example, the leak detection component 1025 can trigger a notification, such as an alarm, emittance of a light, a pop up, etc. to inform a user that fluid has been received in the containment tray 102. In at least one example, the leak detection component 1025 can include one or more of a leak detection sensor, a color changing sensor, a signal sending sensor, etc. In some examples, the leak detection component 1025 can include a leak detection cable. For example, the leak detection cable can include a cable around which a pair of sensing wires are concentrically wrapped. When a conductive fluid comes in contact with the leak detection cable, it completes an electrical circuit, triggering a notification. Accordingly, the leak detection component 1025 can provide a visual and/or an electric notification when there is a leak of fluid received in the containment tray 102.

Figure 2:
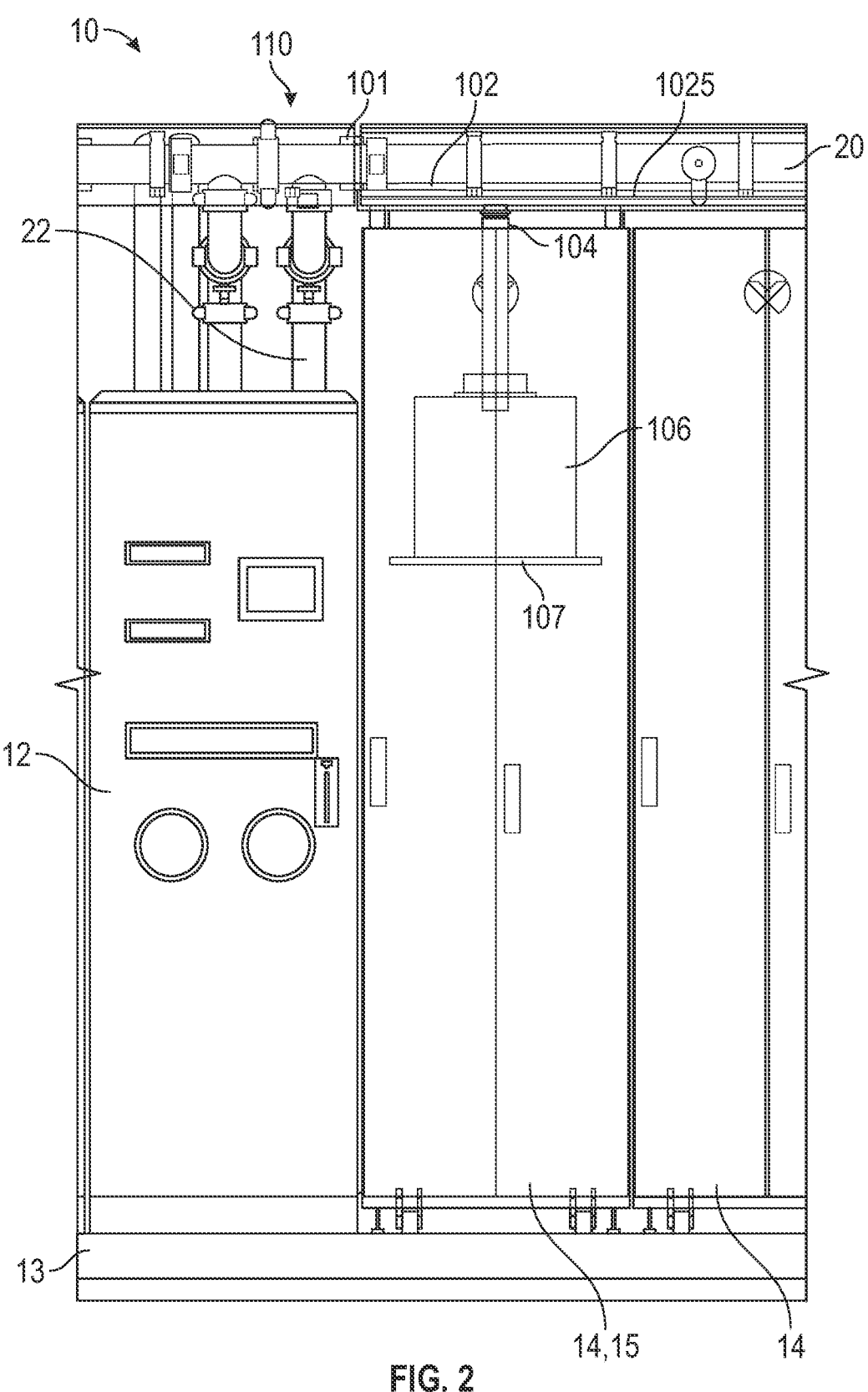
FIG. 2 illustrates a partial view of the computing assembly, showing a containment receptacle received in a support rack.
Figure 3:
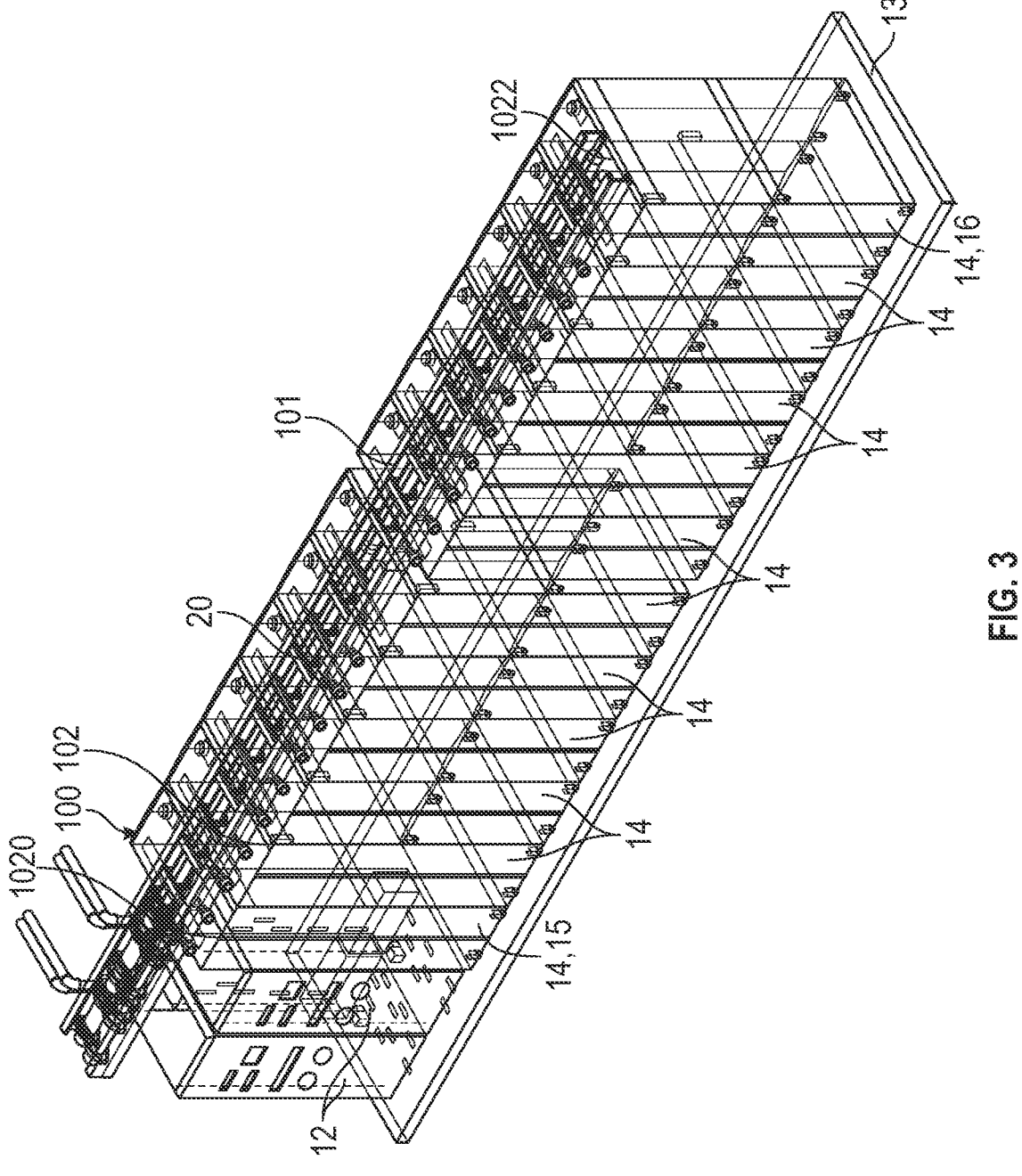
FIG. 3 illustrates a top perspective view of the computing assembly, omitting the computing devices in the racks.

In at least one example, the containment tray 102 can be in fluid communication with a containment receptacle 106, as illustrated in FIGS. 1A-2. The containment receptacle 106 can be operable to receive fluid that leaks into the containment tray 102. The containment receptacle 106 can be operable to be drained easily without dismantling any of the rest of the manifold assembly 100.

In at least one example, the containment receptacle 106 can be received in a support rack 15, 16. For example, as illustrated in FIGS. 1A-2, the containment receptacle 106 can be received in the first support rack 15. In at least one example, the containment receptacle 106 can be positioned on a shelf 107 in the support rack 15, 16.

The containment tray 102 can be configured to direct the fluid that leaks from the secondary manifold 20 towards the containment receptacle 106 such that the fluid is received in the containment receptacle 106. The containment tray 102 may span between a first side 1020 and a second side 1022. For example, the first side 1020 can correlate with the first support rack 15, and the second side 1022 can correlate with the second support rack 16. In at least one example where the containment receptacle 106 is received in the first support rack 15, the containment tray 102 may have a slope that lowers from the second side 1022 towards the first side 1020. Accordingly, any of the fluid that is received in the containment tray 102 flows towards the first side 1020 to be received in the containment receptacle 106. A containment connection 104 (shown in FIG. 2) can be formed between the containment tray 102 and the containment receptacle 106. The containment connection 104 can include a conduit in fluid communication (e.g., fluidly coupled) with the containment tray 102 and the containment receptacle 106, a valve in fluid communication with the containment tray 102 and the containment receptacle 106, an aperture formed in the containment tray 102 and in fluid communication with the containment receptacle 106, etc. The containment connection 104 can be in connection with the first side 1020 and/or adjacent to the first side 1020 of the containment tray 102. Accordingly, as the fluid flows towards the first side 1020 of the containment tray 102, the fluid flows into the containment connection 104 and into the containment receptacle 106.

Similarly, when the containment receptacle 106 is received in the second support rack 16, the containment tray 102 may have a slope that lowers from the first side 1020 towards the second side 1022. Accordingly, any of the fluid that is received in the containment tray 102 flows towards the second side 1022 to be received in the containment receptacle 106.

With the containment receptacle 106, any leaked fluid is self-stored in the manifold system 100 by the containment tray 102 and the containment receptacle 106. In at least one example, the containment receptacle 106 and/or the containment tray 102 can be operable to contain all of the fluid in the loop in case of a leak. Accordingly, the manifold system 100 is operable to prevent any fluid (even if it is all of the fluid) to flow into and damage the computing devices 50 in the computing assembly 10. The manifold system 100 is then a stand-alone system with a secondary manifold 20 with leak containment that does not depend on the data center design as with conventional systems.

The embodiments shown and described above are only examples. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure to the full extent indicated by the broad general meaning of the terms used in the attached claims. It will therefore be appreciated that the embodiments described above may be modified within the scope of the appended claims.

What is claimed is:

1. A manifold system comprising:
   a support structure disposed above, and supported by, at least two support racks of a plurality of racks;
   a secondary manifold supported by the support structure and operable to be fluidly coupled with a liquid cooling system for each of a plurality of computing devices disposed below the secondary manifold within the plurality of racks; and
   a containment tray disposed between the secondary manifold and the plurality of computing devices, the containment tray operable to receive fluid that leaks from the secondary manifold.

2. The manifold system of claim 1, wherein the containment tray is at least partially transparent.

3. The manifold system of claim 1, further comprising a containment receptacle in fluid communication with the containment tray.

4. The manifold system of claim 3, wherein the containment tray is configured to direct the fluid that leaks from the secondary manifold towards the containment receptacle such that the fluid is received in the containment receptacle.

5. The manifold system of claim 3, wherein the containment receptacle is operable to be received in one of the at least two support racks.

6. The manifold system of claim 1, wherein the secondary manifold is operable to direct flow of the fluid between the plurality of computing devices and a fluid distribution unit.

7. A computing assembly comprising:
   a plurality of racks comprising at least two support racks;
   a plurality of computing devices disposed within the plurality of racks, each of the plurality of computing devices including a liquid cooling system; and
   a manifold system including:
      a support structure disposed above, and supported by, the at least two support racks of the plurality of racks;
      a secondary manifold supported by the support structure, disposed above the plurality of computing devices, and operable to be fluidly coupled with the liquid cooling system for each of the plurality of computing devices; and
      a containment tray disposed between the secondary manifold and the plurality of computing devices, the containment tray operable to receive fluid that leaks from the secondary manifold.

8. The computing assembly of claim 7, wherein the secondary manifold and the containment tray are positioned above the plurality of racks.

9. The computing assembly of claim 8, wherein the support structure comprises a ladder that spans across the manifold system.

10. The computing assembly of claim 9, wherein the at least two support racks comprise two support racks operable to receive the ladder.

11. The computing assembly of claim 7, wherein the manifold system further includes a leak detection component operable to be in fluid communication with the containment tray, the leak detection component operable to detect when the fluid is received in the containment tray.

12. The computing assembly of claim 11, wherein the leak detection component is operable to trigger a notification to inform a user that the fluid is received in the containment tray.

13. The computing assembly of claim 7, further comprising a containment receptacle in fluid communication with the containment tray.

14. The computing assembly of claim 13, wherein the containment tray has a slope operable to direct the fluid received in the containment tray towards the containment receptacle such that the fluid is received in the containment receptacle.

15. The computing assembly of claim 7, further comprising a fluid distribution unit operable to be in fluid communication with the plurality of computing devices, wherein the secondary manifold is operable to direct flow of the fluid between the plurality of computing devices and the fluid distribution unit.

16. A method comprising:

receiving a plurality of racks in a manifold system, the plurality of racks including at least two support racks;

fluidly coupling a liquid cooling system for each of a plurality of computing devices received in the plurality of racks with a secondary manifold of the manifold system, wherein the secondary manifold is positioned above the plurality of computing devices and supported by a support structure disposed above, and supported by, the at least two support racks of the plurality of racks; and receiving fluid that leaks from the secondary manifold in a containment tray disposed between the secondary manifold and the plurality of computing devices.

17. The method of claim 16, further comprising:

detecting, via a leak detection component in fluid communication with the containment tray, that the fluid is received in the containment tray; and triggering a notification to inform a user that the fluid is received in the containment tray.

* * * * *